(12) United States Patent
Su et al.

(10) Patent No.: US 6,904,960 B1
(45) Date of Patent: Jun. 14, 2005

(54) HEAT DISSIPATION APPARATUS

(75) Inventors: Sheng-Pin Su, Taoyuan (TW); Feng Zhi Liu, Taoyuan (TW); Shih H. Chen, Taoyuan (TW)

(73) Assignee: Sonicedge Industries Corp., Taoyuan (TW)

( * ) Notice: Subject to any disclaimer, the term of this patent is extended or adjusted under 35 U.S.C. 154(b) by 43 days.

(21) Appl. No.: 10/731,165

(22) Filed: Dec. 10, 2003

(51) Int. Cl.[7] ................................................. F01P 5/04
(52) U.S. Cl. .................. 165/122; 415/209.1; 417/423.5
(58) Field of Search ............. 165/122; 415/208.1–220; 417/423.5

(56) References Cited

U.S. PATENT DOCUMENTS

| | | | | |
|---|---|---|---|---|
| 3,644,066 A | * | 2/1972 | Heob et al. ................. 417/354 |
| 3,868,992 A | * | 3/1975 | Getz et al. .................... 165/51 |
| 4,123,197 A | * | 10/1978 | Keem et al. ................. 415/123 |
| 5,572,403 A | * | 11/1996 | Mills ........................... 361/695 |
| 5,839,205 A | * | 11/1998 | Hung ............................. 34/97 |
| 6,406,257 B1 | * | 6/2002 | Houdek .................... 415/213.1 |
| 6,612,817 B2 | * | 9/2003 | Lin et al. .................. 417/423.5 |
| 6,652,230 B1 | * | 11/2003 | Huang et al. ............. 415/198.1 |
| 6,663,342 B2 | * | 12/2003 | Huang et al. ............. 415/121.2 |

* cited by examiner

Primary Examiner—Paul J. Hirsch

(57) ABSTRACT

A heat dissipation apparatus has an enclosure, in which a lateral fan seat is integrally formed with the enclosure. The lateral fan seat divides the interior space of the enclosure into an upper chamber and a lower chamber. An axis is installed across the upper and the lower chambers through a center of the fan seat. A coil set, a magnetic element and a plurality of blades are mounted about the axis in each of the upper and lower chambers. Thereby, two sets of fans are formed in a single enclosure to increase the heat dissipation effect while the assembly convenience is improved.

5 Claims, 4 Drawing Sheets

HEAT DISSIPATION APPARATUS

BACKGROUND OF THE INVENTION

The present invention relates to a heat dissipation apparatus, and more particular, to a heat dissipation apparatus including two sets of fans installed within a single enclosure. Therefore, an enhanced dissipation effect is resulted because the speed and pressure generated by rotation of the fan can be adjusted according to specific requirement, while the assembly convenience is improved.

To enhance overall wind speed and pressure, two heat dissipation fans 2A and 2A' are typically combined or stacked in series as shown in FIG. 1. Thereby, the damage of the system caused interruption of any of the fans can be avoided. However, to assemble the fans 2A and 2A' together, fasteners such as screws have to be applied to the frames of the fans 2A and 2A'.

When the fans 2A and 2A' are secured to each other in series, increase in wind pressure is not significant because the frames of the fans 2A and 2A' normally include ribs 21A for reinforcing stability of the attachment. When the first fan 2A rotates to generate an air flow, the air flow is easily interrupted by the ribs 21A to cause turbulence. When the turbulence is circulating into the fan 2A', the wind speed and pressure generated by the fan 2A' is seriously affected. Even when the fan 2A' remains stationary when the fan 2A rotates, the wind pressure will be lowered by the installation of the fan 2A'. The serial connection of the fans 2A and 2A' results in significant resistance, which degrades rotation efficiency and increases the noise.

BRIEF SUMMARY OF THE INVENTION

The present invention provides a heat dissipation apparatus which integrates two sets of fans into a single enclosure, such that assembly convenience is greatly improved, while the heat dissipation efficiency is enhanced.

The heat dissipation apparatus provided by the present invention is operative to adjust the wind speed and pressure of the air flow generated by the sets of fans.

The heat dissipation apparatus comprises an enclosure in which a fan seat is laterally disposed. The fan seat divides an interior space of the enclosure into two chambers. The heat dissipation apparatus further comprises a shaft extending through a center of the fan seat across both the chambers. In each of the chambers, a set of fan is installed about the shaft. Each set of fans includes a coil set, a magnetic device and a set of blades.

The fan seat includes at least one stationary guiding blade to guide the air flow from one set of fan into the other. Therefore, the turbulence caused by the air flow generated by the other set of fan is prevented. The wind speed and pressure can thus be adjusted as required.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed

BRIEF DESCRIPTION OF THE DRAWINGS

These, as well as other features of the present invention, will become apparent upon reference to the drawings wherein.

DETAILED DESCRIPTION OF THE INVENTION

Figure 1:
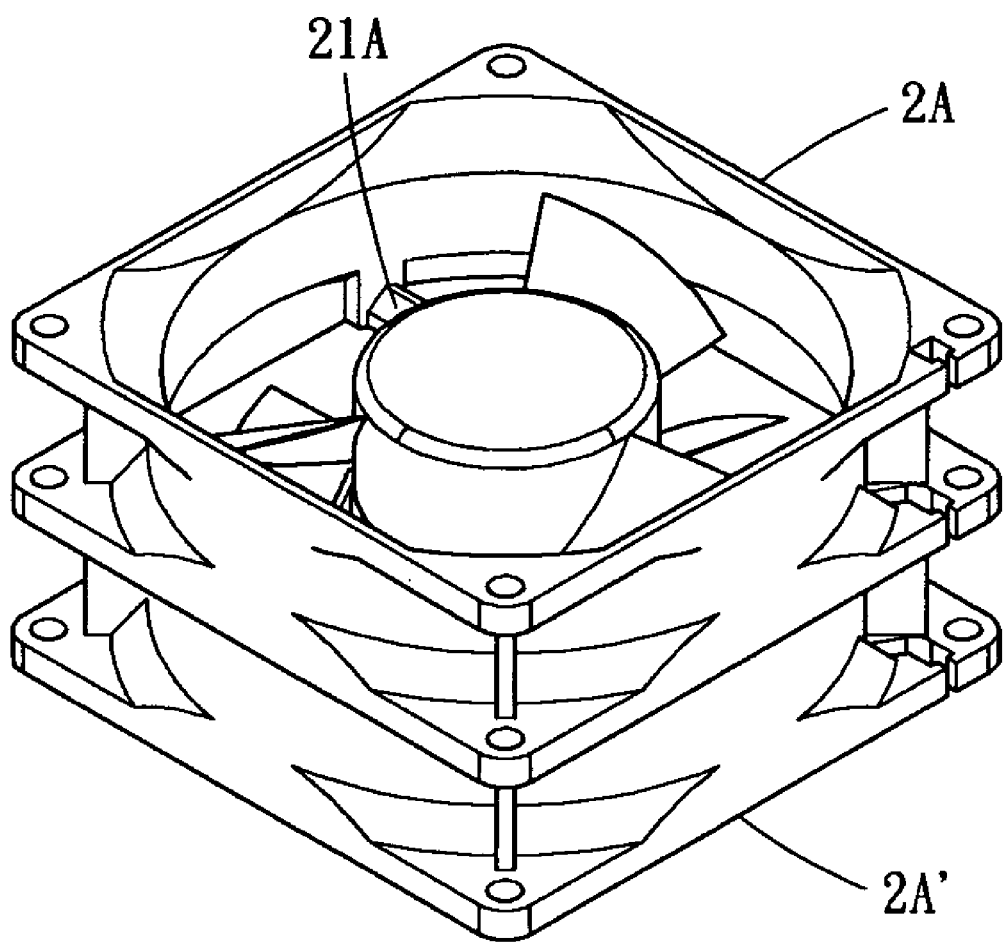
FIG. 1 shows a perspective view of a conventional fan assembly.

Reference will now be made in detail to the preferred embodiments of the present invention, examples of which are illustrated in the accompanying drawings. Wherever possible, the same reference numbers are used in the drawings and the description to refer to the same or like parts.

Figure 2:
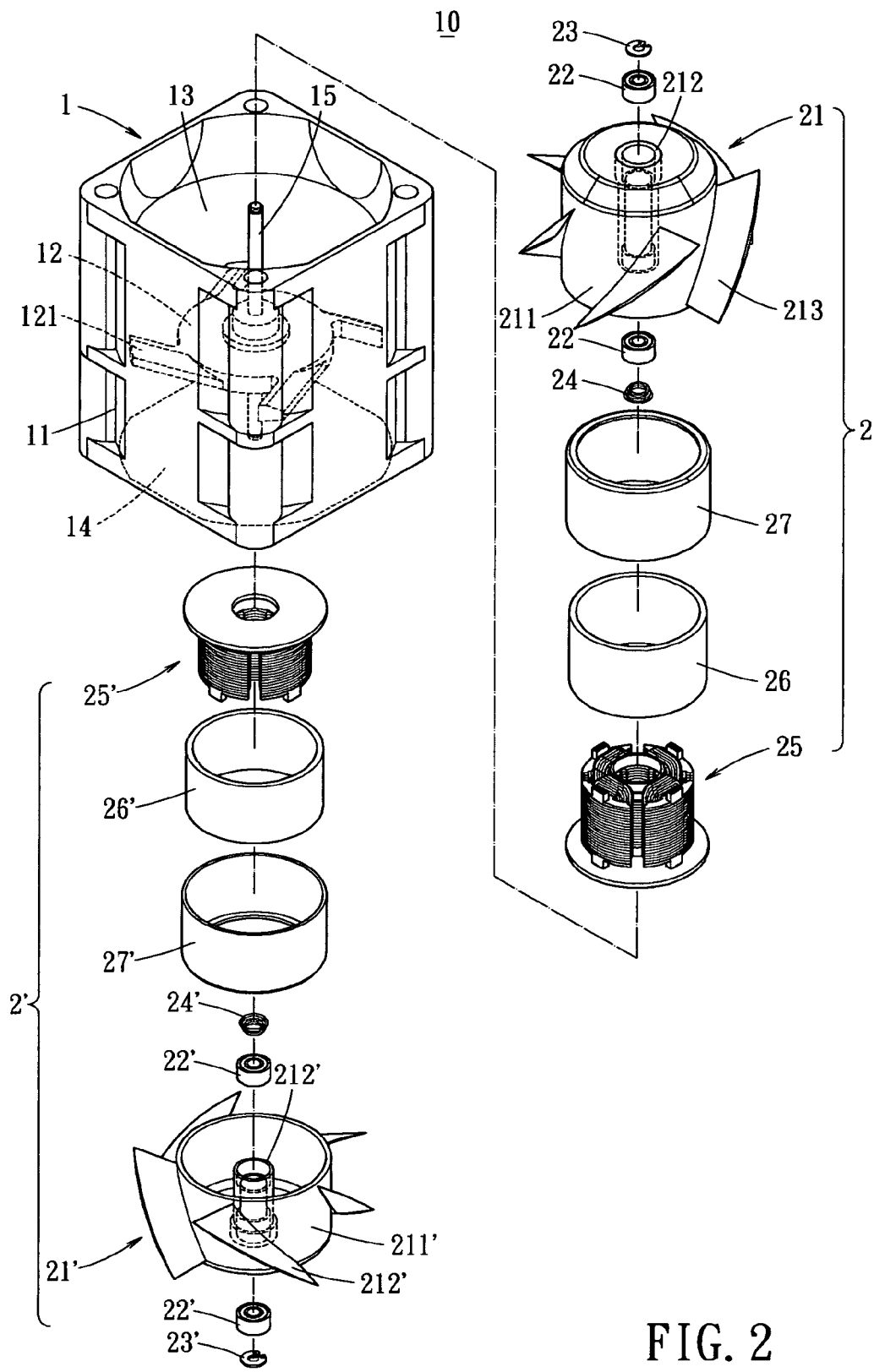
FIG. 2 shows an exploded view of a heat dissipation apparatus provided by the present invention.
Figure 4:
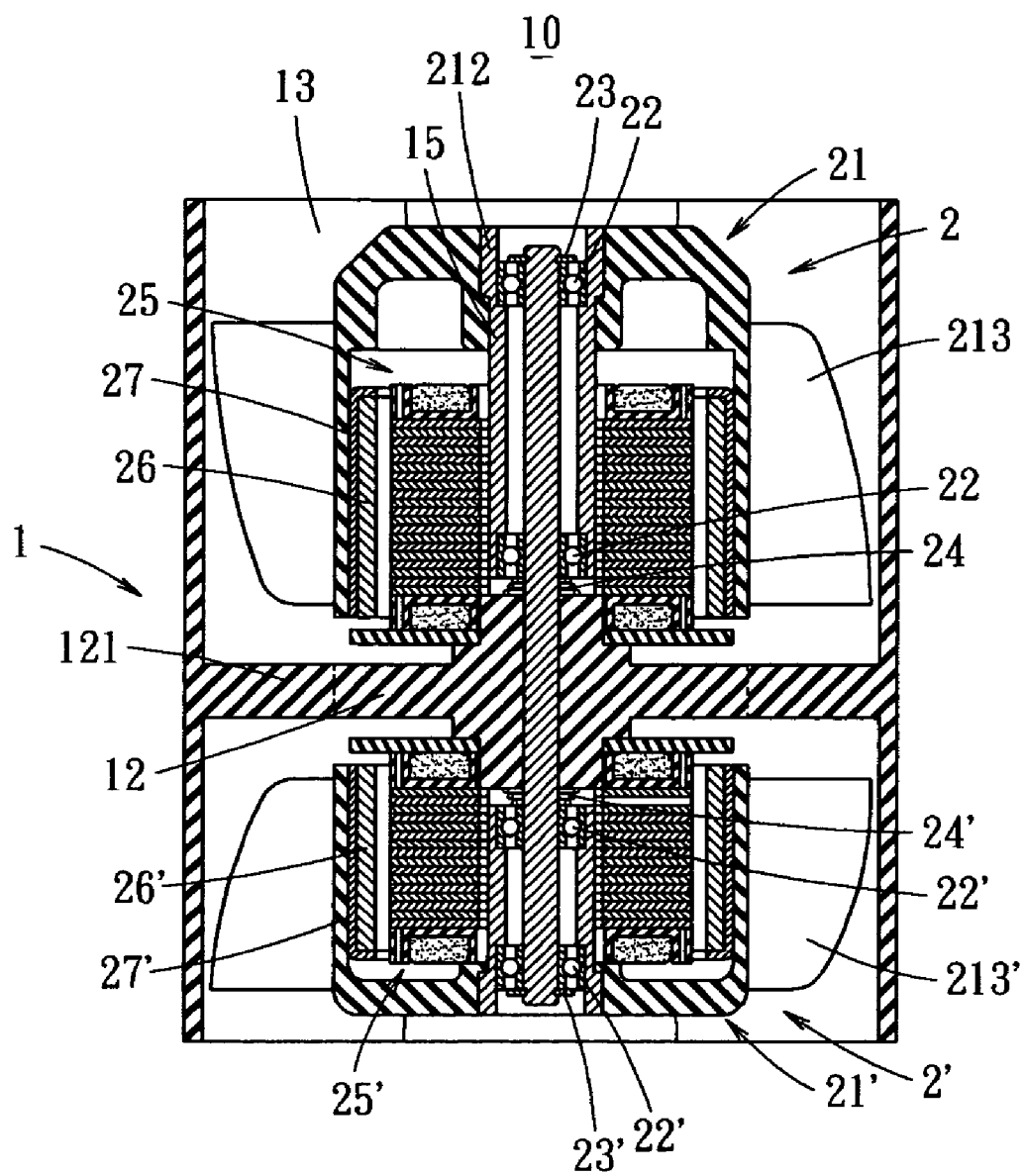
FIG. 4 shows a cross sectional view of the heat dissipation apparatus.

The present invention provides a heat dissipation apparatus 10 as shown in FIG. 2. The heat dissipation apparatus 10 includes an enclosure or housing 1, in which a lateral fan seat 12 (as shown in FIG. 4) is integrally formed. The fan seat 12 divides an interior space of the enclosure 10 into an upper chamber 13 and a lower chamber 14 to accommodate two sets of fans 2 and 2' therein, respectively. As shown, the fan seat 12 includes a substantially circular dish and at least one guiding blades 121 (stationary blade) extending radially from a periphery of the body dish. The heat dissipation apparatus 10 further comprises a shaft 15 extending through a center of the fan seat 12 into both the upper chamber 13 and the lower chamber 14.

The upper and lower chambers 13 and 14 comprise fans 21 and 21' in mechanical communication with the shaft 15, respectively. The fans 21 and 21' comprise hubs 211 and 211' about the shaft 15, hollow bushings 212 and 212' between the shaft 15 and the hubs 211 and 211', respectively, blades extending radially from an external periphery of the hubs 211 and 211'. The fans 21 and 21' are mounted to the shaft 15 by means of ball bearings 22 and 22', C-rings 23 and 23', and springs 24 and 24'. Each of fan sets 2 and 2' further comprises a coil set 25, 25', respectively, and magnetic strips 26, 26' and magnetic frames 27, 27' between the hubs 21, 21' and the coil sets 25, 25'.

Figure 3:
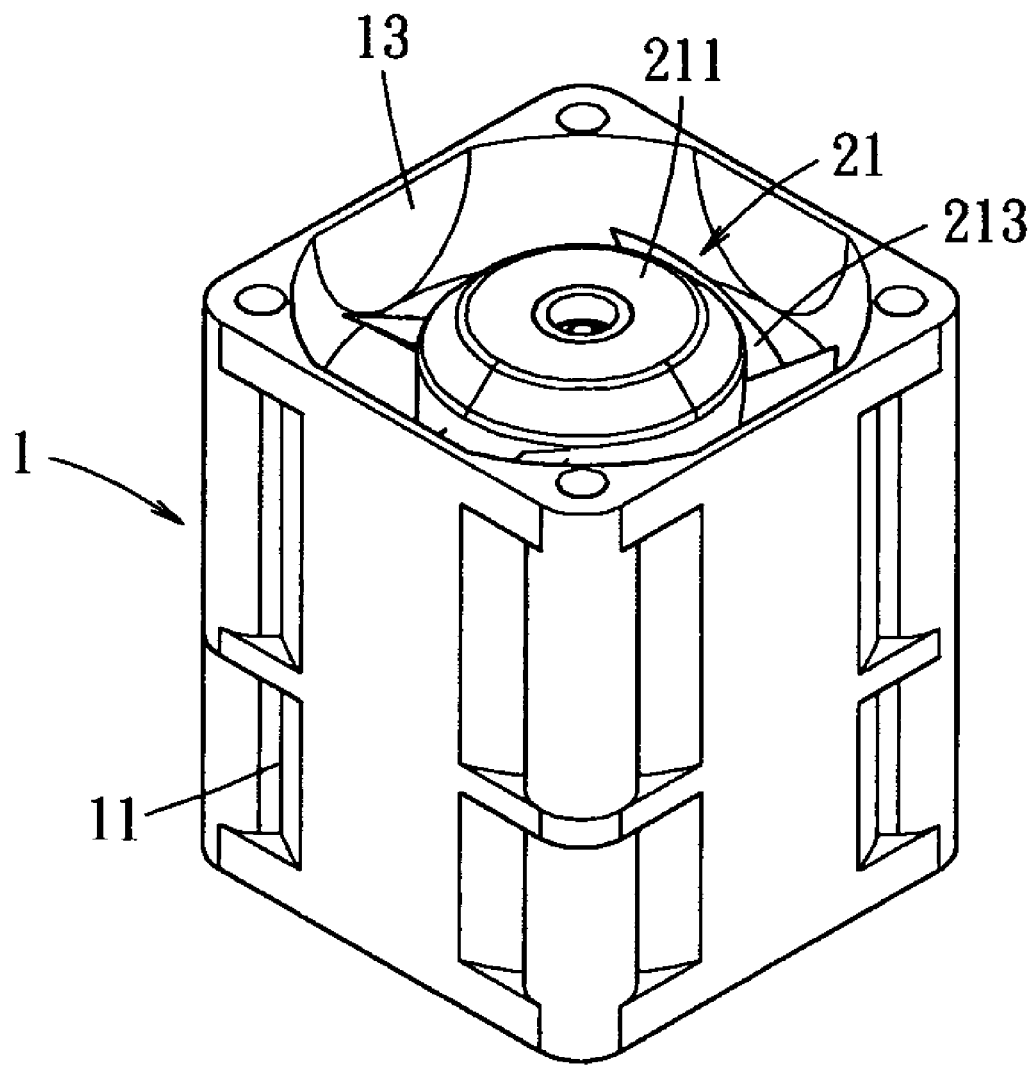
FIG. 3 shows a perspective view of the heat dissipation apparatus.

Referring to FIGS. 2 and 4, during assembly, the coil sets 25, 25', magnetic strips 26, 26' and magnetic frames 27, 27' are installed in the hubs 211 and 211' of the fans 21, 21', respectively. The bushings 212 and 212' are then inserted through the hubs 21 and 21', respectively. The fans 2 and 2' are then mounted to two sides of the fan seat 12, and the while fan assembly is then disposed in the enclosure 1. To secure the fans 2 and 2' to two sides of the fan seat 12, the through holes of the bushings 212 and 212' are aligned with the shaft 15 at two sides of the fan seat 12. Once the shaft 15 is inserted into the hubs 212 and 212', the C-rings 23 and 23' and the springs 24 and 24' are engaged with the shaft 15. Thereby, a heat dissipation apparatus with two fan sets 2 and 2' is obtained as shown in FIG. 3.

In the present invention, the integrally fan laterally disposed in the enclosure divides the interior space of the enclosure into two chambers, such that two fan sets can be installed in a single enclosure. The guiding blades 121 extending from the central circular dish of the fan seat guides the air flow generated by one of the fan sets 2 and 2' into the other without causing turbulence. Therefore, the wind speed and pressure of the air flow can be adjusted as required.

This disclosure provides exemplary embodiments of the present invention. The scope of this disclosure is not limited by these exemplary embodiments. Numerous variations, whether explicitly provided for by the specification or implied by the specification, such as variations in shape, structure, dimension, type of material or manufacturing process may be implemented by one of skill in the art in view of this disclosure.

What is claimed is:

1. A heat dissipation apparatus, comprising:
   an enclosure, including a fan seat laterally disposed in an interior space of the enclosure to divide the interior space into an upper chamber and a lower chamber;
   a shaft, extending through a center of the fan seat across the upper and lower chambers; and
   two sets of fans, installed in the upper and lower chambers about the shaft, respectively, wherein each of the set of fans includes a set of blades extending radially about the shaft, a set of coils between the blades and the shaft, and a magnetic device between the blades and the coil.

2. The apparatus of claim 1, wherein the fan seat includes at least one guiding fan.

3. The apparatus of claim 2, wherein the fan seat includes a substantially circular dish and the guiding blades extending from a periphery of the circular dish.

4. The apparatus of claim 1, wherein the fan seat includes at least two guiding blades.

5. The apparatus of claim 1, wherein each of the sets of fans comprises a hub, a bushing encircled by the hub, a plurality of blades extending radially from a periphery of the hub, and a plurality of ball bearings and a C-ring to secure the set of fan to the shaft.

* * * * *